(12) United States Patent
Hama et al.

(10) Patent No.: US 11,495,774 B2
(45) Date of Patent: Nov. 8, 2022

(54) ELECTRO-OPTICAL DEVICE AND ELECTRONIC APPARATUS

(71) Applicant: SEIKO EPSON CORPORATION, Tokyo (JP)

(72) Inventors: Yoshitaka Hama, Chino (JP); Naotaka Kubota, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 178 days.

(21) Appl. No.: 17/155,042

(22) Filed: Jan. 21, 2021

(65) Prior Publication Data

US 2021/0225959 A1    Jul. 22, 2021

(30) Foreign Application Priority Data

Jan. 22, 2020 (JP) .............................. JP2020-008190

(51) Int. Cl.
   *H01L 27/32*  (2006.01)
   *H01L 51/52*  (2006.01)
   *H01L 23/00*  (2006.01)
   *H05B 33/06*  (2006.01)

(52) U.S. Cl.
   CPC .......... *H01L 51/5253* (2013.01); *H01L 24/05* (2013.01); *H01L 24/08* (2013.01); *H01L 27/3276* (2013.01); *H01L 51/524* (2013.01); *H01L 51/5246* (2013.01); *H05B 33/06* (2013.01); *H01L 27/3218* (2013.01); *H01L 2224/83851* (2013.01); *H01L 2924/15151* (2013.01)

(58) Field of Classification Search
   CPC ............. H01L 27/3276; H01L 51/5246; H01L 51/524; H01L 51/5253; H01L 2924/15151; H01L 2224/83851; H01L 24/05; H01L 24/08; H05B 33/02; H05B 33/06

See application file for complete search history.

(56) References Cited

U.S. PATENT DOCUMENTS

| 5,930,607 | A | * | 7/1999 | Satou | H01L 27/0266 349/40 |
| 6,601,947 | B1 | * | 8/2003 | Sato | B41J 2/14314 347/68 |
| 2002/0153831 | A1 | * | 10/2002 | Sakakura | H01L 27/1214 313/504 |
| 2005/0106781 | A1 | | 5/2005 | Ogata | |

(Continued)

FOREIGN PATENT DOCUMENTS

CN   101355087 A  *  1/2009  ......... H01L 27/3244
JP   H07321158       12/1995

(Continued)

OTHER PUBLICATIONS

Machine translation, Xu, Chinese Pat. Pub. No. CN101355087A, translation date: Sep. 3, 2022, Espacenet, all pages. (Year: 2022).*

*Primary Examiner* — Victoria K. Hall
(74) *Attorney, Agent, or Firm* — JCIPRNET

(57) ABSTRACT

An organic EL device includes a substrate including a light-emitting element, a mounting terminal, and a protective film that is provided on the light-emitting element and that has an opening portion overlapping with the mounting terminal in plan view. The substrate has recessed portion that communicates with the opening portion.

11 Claims, 15 Drawing Sheets

(56) References Cited

U.S. PATENT DOCUMENTS

| | | | |
|---|---|---|---|
| 2009/0243038 A1* | 10/2009 | Nagai | H01L 27/11504 |
| | | | 257/532 |
| 2013/0087798 A1* | 4/2013 | Misaki | H01L 27/1214 |
| | | | 438/34 |
| 2014/0361273 A1* | 12/2014 | Nozawa | H01L 51/5246 |
| | | | 438/46 |
| 2014/0367661 A1* | 12/2014 | Akagawa | H01L 51/5256 |
| | | | 438/26 |
| 2017/0040569 A1* | 2/2017 | Watabe | H01L 51/003 |
| 2017/0237032 A1* | 8/2017 | Koshihara | H01L 51/5253 |
| | | | 257/88 |
| 2017/0237033 A1* | 8/2017 | Koshihara | H01L 27/3276 |
| | | | 257/88 |
| 2018/0226617 A1* | 8/2018 | Nakagawa | H01L 51/56 |
| 2019/0058121 A1* | 2/2019 | Tanaka | H01L 27/32 |
| 2019/0197950 A1* | 6/2019 | Shibusawa | H01L 27/3265 |
| 2019/0348476 A1* | 11/2019 | Kato | H05B 33/04 |
| 2019/0348487 A1* | 11/2019 | Kim | H01L 24/81 |
| 2019/0369788 A1* | 12/2019 | Tada | H01L 27/3258 |
| 2020/0019281 A1* | 1/2020 | Miyamoto | G06F 3/041 |
| 2020/0235169 A1* | 7/2020 | Miyamoto | H05B 33/04 |
| 2020/0303490 A1* | 9/2020 | Tomioka | H05B 33/22 |
| 2021/0059040 A1* | 2/2021 | Uchiyama | H05K 1/028 |

FOREIGN PATENT DOCUMENTS

| | | |
|---|---|---|
| JP | H10335384 | 12/1998 |
| JP | 2001237265 | 8/2001 |
| JP | 2005101125 | 4/2005 |
| JP | 2009086119 | 4/2009 |
| JP | 2017147046 | 8/2017 |
| JP | 2018106053 | 7/2018 |
| WO | 0058205 | 10/2000 |

\* cited by examiner

ELECTRO-OPTICAL DEVICE AND ELECTRONIC APPARATUS

The present application is based on, and claims priority from JP Application Serial Number 2020-008190, filed Jan. 22, 2020, the disclosure of which is hereby incorporated by reference herein in its entirety.

BACKGROUND

1. Technical Field

The present disclosure relates to an electro-optical device and an electronic apparatus.

2. Related Art

There have been known electro-optical devices that include an organic electroluminescent (EL) element, which is a light-emitting element. Such an electro-optical device includes an element substrate provided with a mounting terminal and configured to drive the organic EL element, and an external coupling substrate electrically coupled to the mounting terminal. For example, JP-A-2017-147046 discloses an electro-optical device in which the mounting terminal is exposed from an opening hole provided in a sealing film having two layers.

Nevertheless, in the electro-optical device of JP-A-2017-147046, there is a problem in that it is difficult to improve an adhesion between the element substrate and the external coupling substrate. Specifically, to protect the light emission function layer with the sealing film, the sealing film is thickened. The mounting terminal is exposed to a front surface of the element substrate from the opening hole provided in the sealing film, making a step between the mounting terminal and the front surface of the element substrate larger. Due to this step, there have been cases in which it is difficult to secure the adhesion between the element substrate and the external coupling substrate when the element substrate and the external coupling substrate are adhered via an anisotropic conductive adhesive or the like. That is, there is demand for an electro-optical device that reliably adheres the element substrate and the external coupling substrate.

SUMMARY

An electro-optical device comprises a substrate including a light-emitting element, a mounting terminal provided on a substrate, and a protective film that is provided on the light-emitting element and that has an opening portion overlapping with the mounting terminal in plan view. The substrate has a recessed portion that communicates with the opening portion.

An electronic apparatus includes the electro-optical device described above.

DESCRIPTION OF EXEMPLARY EMBODIMENTS

In the following drawings, the X, Y, and Z axes are given as coordinate axes orthogonal to each other as necessary, and a direction of an arrow represents a positive direction and a direction opposite to the positive direction represents a negative direction. Note that the +Z direction may be upward and the −Z direction may be downward, and a view from the +Z direction is referred to as a plan view or planar. Furthermore, in the following description, for example, the description "on the substrate" with respect to the substrate may mean any one of being disposed above and in contact with the substrate, being disposed above the substrate with another structure disposed therebetween, being disposed above and partially in contact with the substrate, and being disposed above the substrate with another structure partially interposed therebetween.

1. First Exemplary Embodiment

1.1 Configuration of Organic EL Device

In this exemplary embodiment, an organic electroluminescent (EL) device is illustrated as an electro-optical device. This electro-optical device is used, for example, in a head-mounted display serving as an electronic apparatus described later. First, a configuration of the organic EL device serving as an electro-optical device according to this exemplary embodiment will be described with reference to FIG. 1 to FIG. 3.

Figure 1:
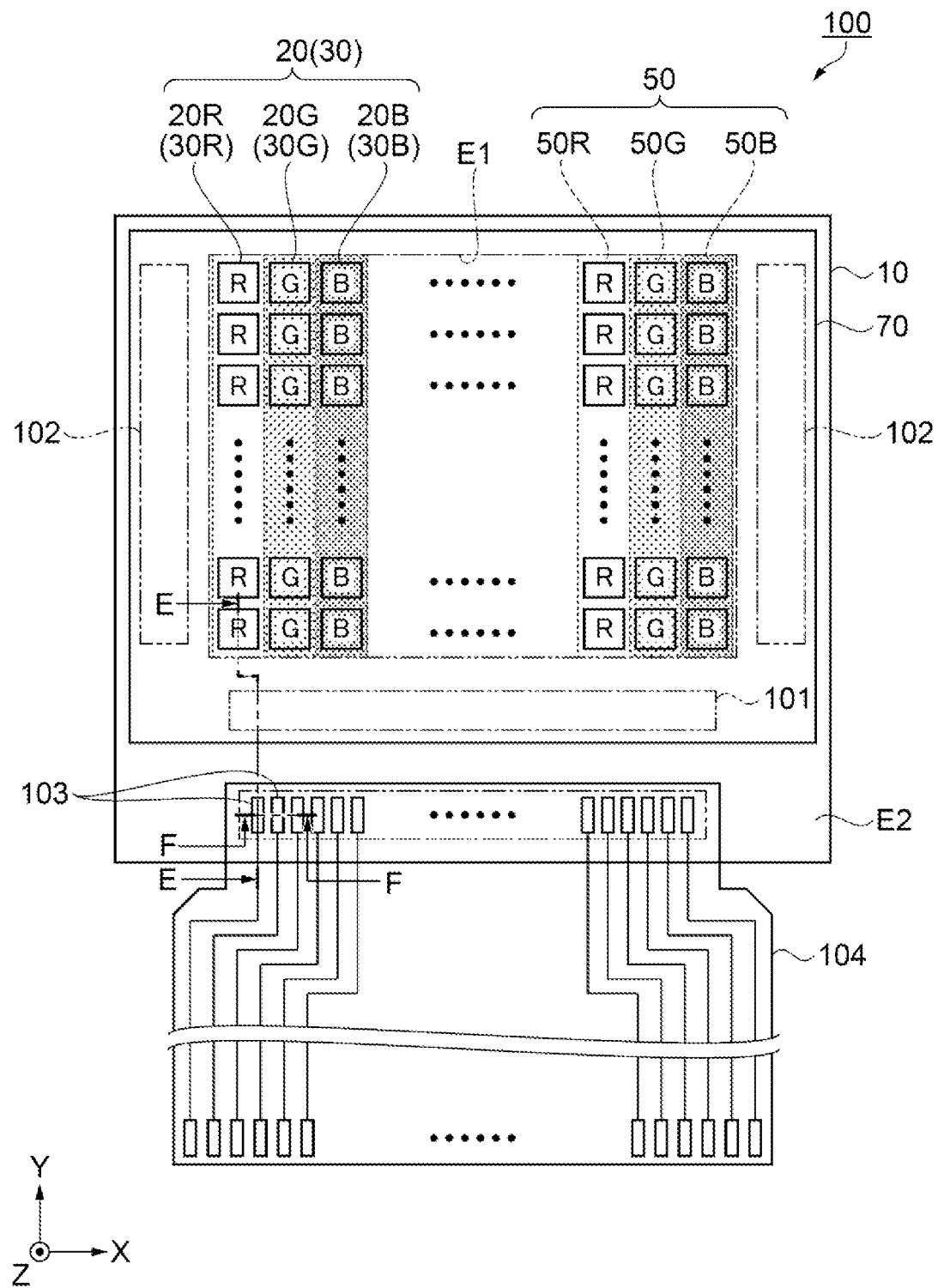
FIG. 1 is an outline plan diagram illustrating a configuration of an organic EL device as an electro-optical device according to a first exemplary embodiment.

As illustrated in FIG. 1, an organic EL device 100 includes an element substrate 10, a protective substrate 70, and an external coupling substrate 104. The organic EL device 100 is an active-drive, top-emission type electro-optical device. A direction in which light is emitted from the organic EL device 100 is the +Z direction and coincides with a normal line direction of the element substrate 10. The element substrate 10 is an example of a substrate in the present disclosure.

The element substrate 10 and the protective substrate 70 are substantially rectangular. The element substrate 10 and the protective substrate 70 each include long sides that face each other in a direction along the Y-axis, and short sides that face each other in a direction along the X-axis. The element substrate 10 and the protective substrate 70 are joined facing each other with a filler (not illustrated) interposed therebetween. As the filler, an epoxy-based adhesive or an acrylic-based adhesive is adopted, for example.

The protective substrate 70 is a substrate having optical transparency. The protective substrate 70 is configured to protect a color filter or the like described later provided to a display region E1. Therefore, a planar size of the protective substrate 70 is larger than that of the display region E1. As the protective substrate 70, a quartz substrate or a glass substrate is used.

On the element substrate 10 are provided an organic EL element 30 serving as a light-emitting element, a data line drive circuit 101, a pair of scanning line drive circuits 102, a plurality of mounting terminals 103 for external coupling, a recessed portion described later, and the like. The element substrate 10 is larger in planar size than the protective substrate 70. Therefore, in the −Y direction of the element substrate 10, there is a region that does not overlap the protective substrate 70 and is upwardly exposed. As the element substrate 10, a quartz substrate or a glass substrate is used.

A plurality of light-emitting pixels 20 are provided in correspondence with the organic EL element 30, and are disposed in a matrix in the display region E1 of the element substrate 10. Specifically, the light-emitting pixel 20 includes sub-pixels 20B, 20G, 20R, and the organic EL element 30 includes organic EL elements 30B, 30G, 30R. The sub-pixel 20B emits blue (B) light in correspondence with the organic EL element 30B. The sub-pixel 20G emits green (G) light in correspondence with the organic EL element 30G. The sub-pixel 20R emits red (R) light in correspondence with the organic EL element 30R.

A color filter 50 is provided in the display region E1. The color filter 50 converts the light emission of the organic EL element 30 into B, G, and R color light. The color filter 50 includes colored layers 50B, 50G, 50R. That is, the colored layer 50B is disposed above the organic EL element 30B of the sub-pixel 20B, the colored layer 50G is disposed above the organic EL element 30G of the sub-pixel 20G, and the colored layer 50R is disposed above the organic EL element 30R of the sub-pixel 20R. Note that, although not illustrated, a resonance structure of light that enhances a luminance of light of a specific wavelength within the emission wavelength range of light emitted from the organic EL element 30 is constructed for each of the sub-pixels 20B, 20G, 20R.

In the display region E1, the light-emitting pixels 20 that can emit light of the same color are disposed in the direction along the Y-axis, and the light-emitting pixels 20 that can emit light of different colors are repeatedly disposed in the order of R, G, B in the direction along the X-axis. Such an arrangement of the light-emitting pixels 20 is referred to as a stripe format. The arrangement of the light-emitting pixels 20 is not limited thereto.

As described above, one pixel in a display unit is constituted by three of the sub-pixels 20B, 20G, 20R adjacent to each other. Note that the unit configuration of the pixel is not limited thereto and, in addition to B, G, R, sub-pixels that can obtain an emission color including white may be included in the pixel unit.

The plurality of mounting terminals 103, the data line drive circuit 101, and the pair of scanning line drive circuits 102 are provided outside the display region E1. The data line drive circuit 101 and the pair of scanning line drive circuits 102 are peripheral circuits configured to drive and control the plurality of light-emitting pixels 20. The data line drive circuit 101 and the pair of scanning line drive circuits 102 are electrically coupled, via the plurality of mounting terminals 103, to the external coupling substrate 104.

The plurality of mounting terminals 103 are provided in a terminal region E2 that does not overlap the protective substrate 70 of the element substrate 10. Specifically, the plurality of mounting terminals 103 are arrayed in the direction along the X axis along the long side in the −Y direction of the two long sides of the element substrate 10. The data line drive circuit 101 is disposed between the plurality of mounting terminals 103 and the display region E1 and extends in the direction along the X-axis. The pair of scanning line drive circuits 102 are provided facing each other in the direction along the X-axis with the display region E1 interposed therebetween.

Figure 2:
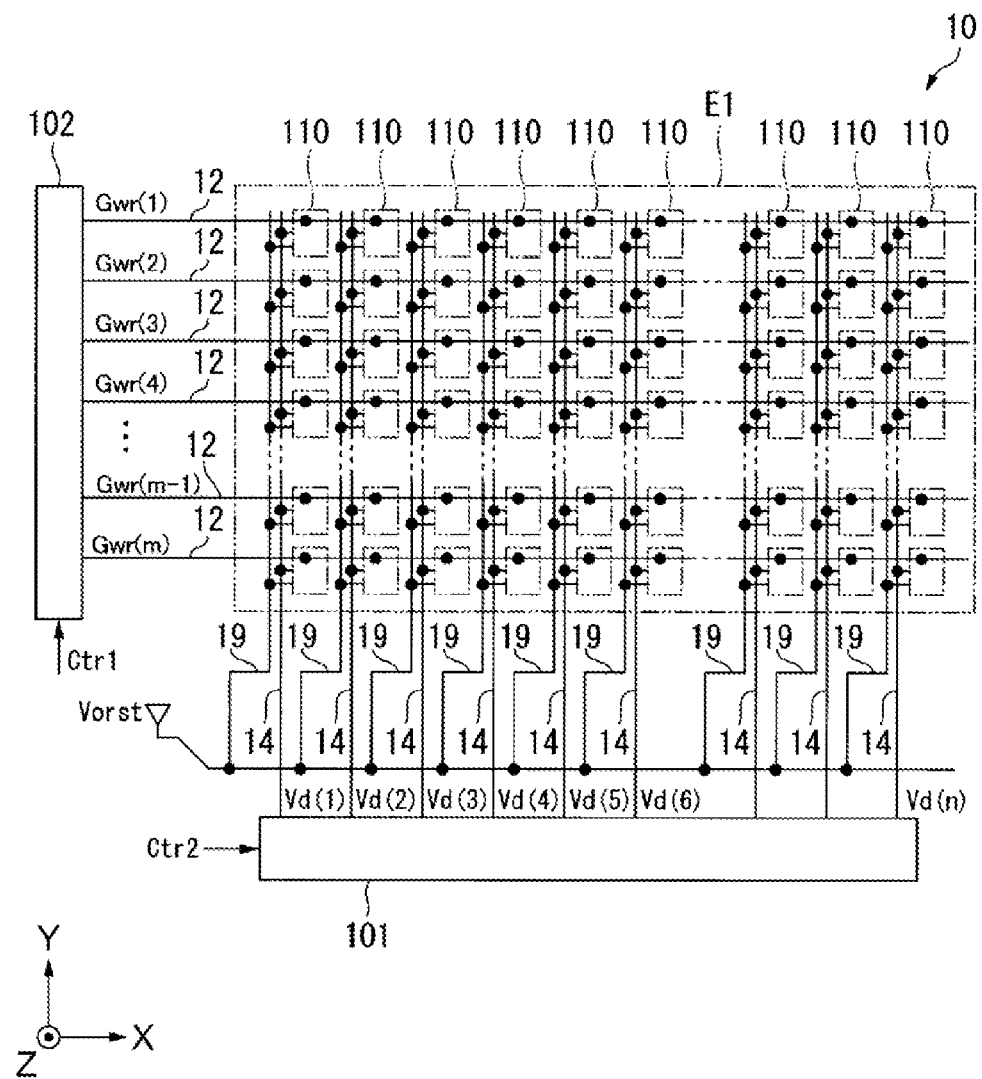
FIG. 2 is an equivalent circuit diagram illustrating an electrical configuration of the organic EL device.

As illustrated in FIG. 2, the element substrate 10 is provided with m rows of scanning lines 12 extending in the direction along the X-axis, and n rows of data lines 14 and power lines 19 extending in the direction along the Y-axis. Note that, in the description of the equivalent circuit diagrams of FIG. 2 and FIG. 3, electrically coupled is simply referred to as coupled.

On the pixel substrate 10, pixel circuits 110 are provided correspondingly to intersections between the m rows of scanning lines 12 and the n columns of data lines 14. That is, in the display region E1, (m rows×n columns) of pixel circuits 110 are disposed in a matrix. The pixel circuit 110 constitutes a portion of the light-emitting pixel 20.

Here, a reset potential Vorst for initialization is supplied to the power lines 19. Although not illustrated, three control lines configured to supply control signals Gcmp, Gel, Gorst are provided in parallel with the scanning lines 12.

The scanning lines 12 are coupled to the scanning line drive circuits 102. The data lines 14 are coupled to the data line drive circuit 101. A control signal Ctrl that controls the scanning line drive circuits 102 is supplied to the scanning line drive circuits 102. A control signal Ctr2 that controls the data line drive circuit 101 is supplied to the data line drive circuit 101.

The scanning line drive circuits 102 generate, in accordance with the control signal Ctrl, scanning signals Gwr (1), Gwr (2), Gwr (3), . . . , Gwr (m−1), Gwr (m) for scanning the scanning lines 12 on a per row basis over a period of a frame. Furthermore, in addition to the scanning signal Gwr, the scanning line drive circuits 102 supply the control signals Gcmp, Gel, Gorst to the control lines. Here, the period of a frame is a period in which the images of one frame are displayed by the organic EL device 100. Specifically, given 120 Hz as a frequency of a vertical synchronization signal included in a synchronization signal, for example, the period of one frame is approximately 8.3 milliseconds.

The data line drive circuit 101 supplies the data signal Vd (1), Vd (2), . . . , Vd (n) corresponding to the gray scale data of the pixel circuit 110 to the data lines 14 of the first, second, . . . , n-th columns for the pixel circuit 110 positioned in a row selected by the scanning line drive circuit 102.

Figure 3:
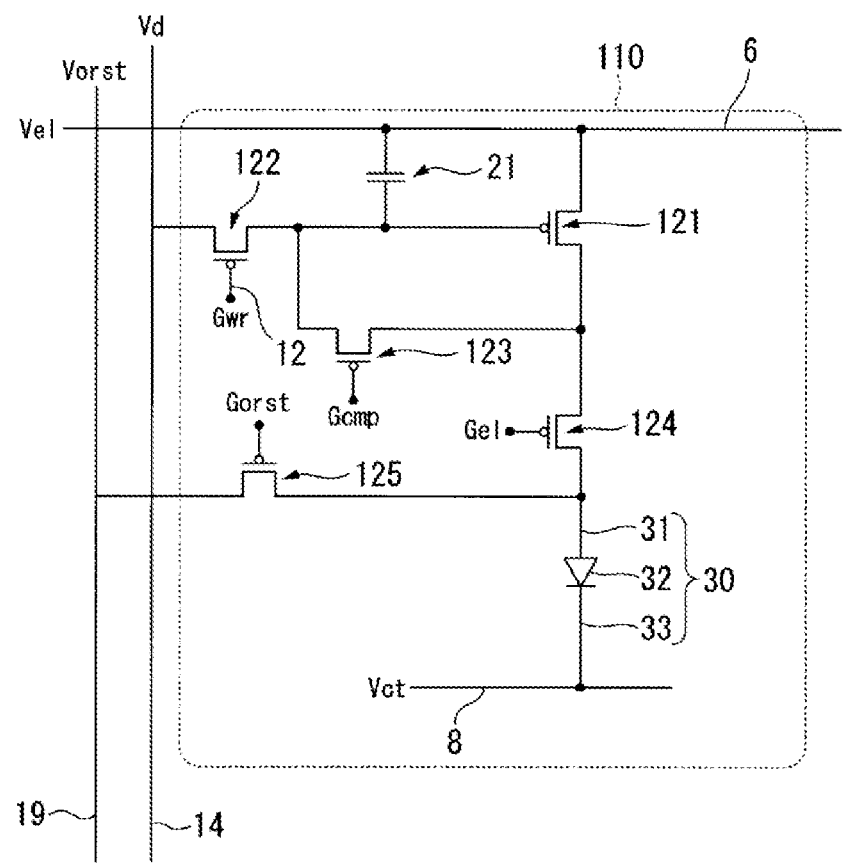
FIG. 3 is an equivalent circuit diagram illustrating an electrical configuration of the organic EL device.

As illustrated in FIG. 3, the pixel circuit 110 includes transistors 121, 122, 123, 124, 125, the organic EL element 30, and a capacitor 21. The scanning signal Gwr, the control signals Gcmp, Gel, Gorst, and the like described above are supplied to the pixel circuit 110. Note that the transistors 121, 122, 123, 124, 125 are metal oxide semiconductor field effect transistors (MOSFETs).

The organic EL element 30 has a structure in which a light emission function layer 32 is interposed between a pixel electrode 31 and a common electrode 33 facing each other.

The pixel electrode 31 is an anode that supplies holes to the light emission function layer 32 and is formed of a conductive material having optical transparency. In this exemplary embodiment, indium tin oxide (ITO) having a film thickness of 200 nm is used as the pixel electrode 31. The pixel electrode 31 is coupled to a drain of the transistor 124 and one of a source or a drain of the transistor 125.

The common electrode 33 is a cathode that supplies electrons to the light emission function layer 32. The common electrode 33 is formed of a conductive material having optical transparency and optical reflectivity, such as an alloy of magnesium (Mg) and silver (Ag), for example. The common electrode 33 is provided across the plurality of light-emitting pixels 20 and is coupled to a power line 8. A potential Vct being a low-order side of a power source in the pixel circuit 110 is supplied to the power line 8.

The light emission function layer 32 includes, although not illustrated, a hole injection layer, a hole transport layer, an organic light-emitting layer, an electron transport layer, and the like, which are stacked upwardly in that order from the side of the pixel electrode 31. In the organic EL element 30, the holes supplied from the pixel electrode 31 and the electrons supplied from the common electrode 33 are coupled in the light emission function layer 32, thereby causing the light emission function layer 32 to emit light.

In the element substrate 10, a power line 6 is provided intersecting each of the power lines 19 and extending in the direction along the X-axis. Note that the power source line 6 may be provided extending in the direction along the Y-axis, or may be provided extending in both the direction along the X-axis and the direction along the Y-axis.

A source of the transistor 121 is coupled to the power line 6, and a drain of the transistor 121 is coupled to the one of a source and a drain of the transistor 123 and to the one of a source and a drain of the transistor 124. A potential Vel being a high-order side of the power source in the pixel circuit 110 is supplied to the power line 6. Further, one end of the capacitor 21 is coupled to the power line 6. The transistor 121 functions as a drive transistor in which a current corresponding to the voltage between a gate and the source of the transistor 121 flows.

A gate of the transistor 122 is coupled to the scanning line 12, and one of the source and a drain of the transistor 122 is coupled to the data line 14. Further, the other of the source and the drain of the transistor 122 is coupled to the gate of the transistor 121, the other end of the capacitor 21, and one of the source and the drain of the transistor 123. The transistor 122 is coupled between the gate of the transistor 121 and the data line 14, and functions as a write transistor configured to control the electrical coupling between the gate of the first transistor 121 and the data line 14.

A gate of the transistor 123 is coupled to a control line, and the control signal Gcmp is supplied thereby. That is, the transistor 123 functions as a threshold value compensation transistor configured to control the electrical coupling between the gate and the drain of the transistor 121.

A gate of the transistor 124 is coupled to a control line, and the control signal Gel is supplied thereby. The drain of the transistor 124 is coupled to one of the source and the drain of the transistor 125 and to the pixel electrode 31 of the organic EL element 30. The transistor 124 functions as a light emission control transistor configured to control the electrical coupling between the drain of the transistor 121 and the pixel electrode 31 of the organic EL element 30.

A gate of the transistor 125 is coupled to a control line, and the control signal Gorst is supplied thereby. The other of the source and the drain of the transistor 125 is coupled to the power line 19, and the reset potential Vorst is supplied thereby. The transistor 125 functions as an initialization transistor configured to control the electrical coupling between the power line 19 and the pixel electrode 31 of the organic EL element 30.

In the following description, the transistors 122, 123, 124, 125 may simply be referred to as transistors T.

A layer configuration of the organic EL device 100 will now be described with reference to FIG. 4 and FIG. 5. Note that, in FIG. 4 and FIG. 5, each of the plurality of conductive bodies is illustrated as one layer or a stacked film of a plurality of layers.

Figure 4:
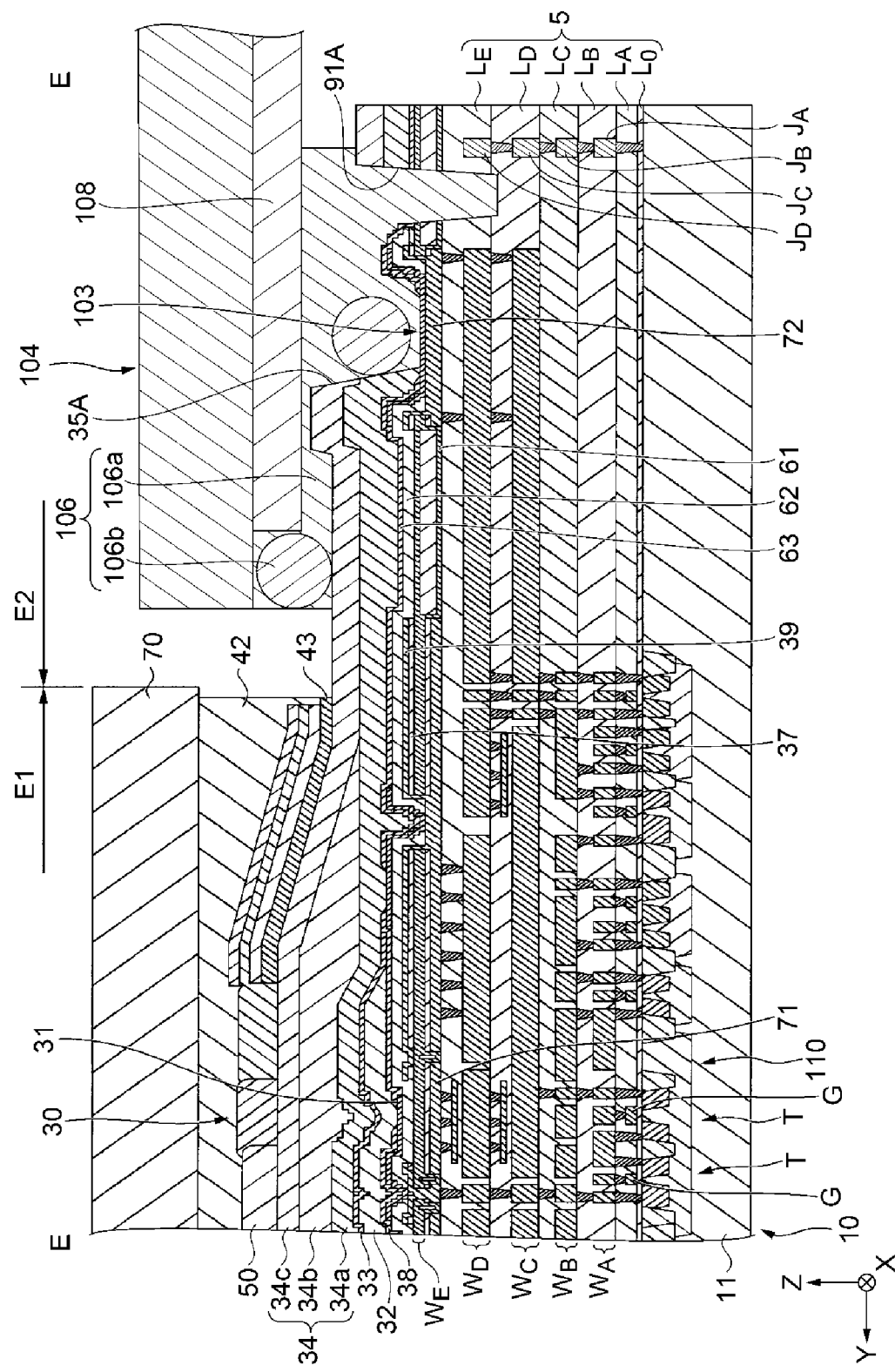
FIG. 4 is a schematic cross-sectional view of the organic EL device along line E-E in FIG. 1.

As illustrated in FIG. 4, the organic EL device 100 includes the element substrate 10, the protective substrate 70, and the external coupling substrate 104.

The element substrate 10 includes a base material 11, and a circuit layer 5 including the pixel circuit 110, the organic EL element 30 as a light-emitting element, the protective film 34 configured to protect the organic EL element 30, the color filter 50, and the filler 42 formed in this order on the base material 11. The protective substrate 70 is disposed facing the element substrate 10 with the filler 42 interposed therebetween to protect the color filter 50.

The organic EL device 100 is top-emission type as described above. Thus, the light emission from the light emission function layer 32 of the sub-pixels 20R, 20G, 20B described above is reflected by a conductive body 71, passed through the color filter 50, and extracted upward of the protective substrate 70. Further, as the base material 11, an opaque substrate such as silicon or ceramic may be used in addition to a substrate having optical transparency such as quartz glass. In the organic EL device 100, a silicon substrate, which is a semiconductor substrate, is adopted as the base material 11, and the pixel circuit 110 is provided with the transistors T. The pixel circuit 110 is included in the circuit layer 5. In this specification, an upper surface may also be referred to as a front surface.

On the substrate 11, the transistors T of the pixel circuit 110 are formed in the display region E1. Further, although not illustrated, a transistor of the data line drive circuit 101 is formed in the terminal region E2. The transistors T each include an active region (source/drain region; not illustrated) formed on a front surface of the substrate 11, an interlayer insulating film Lo that is a gate insulating film configured to cover the front surface of the substrate 11, and a gate G formed on the interlayer insulating film Lo.

The active region includes an ion injection region in which impurity ions are injected into the substrate 11. A channel region of each of the transistors T is positioned between the source region and the drain region. The channel region is injected with ions of a type different from that of the active region. The gates G of the transistors T are disposed facing the channel region with the interlayer insulating film Lo interposed therebetween.

A plurality of interlayer insulating films $L_A$, $L_B$, $L_C$, $L_D$, $L_E$ and a plurality of wiring layers $W_A$, $W_B$, $W_C$, $W_D$, $W_E$ are alternately stacked on the interlayer insulating film Lo on which the gates G of the transistors T are formed, forming a multilayer wiring layer. As the formation material of the interlayer insulating film $L_A$ to the interlayer insulating film $L_E$, an insulating inorganic material such as silicon nitride or silicon oxide, for example, is used. To form the wiring layer $W_A$ to the wiring layer $W_E$, a low-resistance conductive material containing aluminum, silver, or the like, for example, is used.

Here, guard ring layers $J_A$, $J_B$, $J_C$, $J_D$ are planarly disposed in a substantially frame shape on an outer edge of the element substrate 10. The guard ring layers $J_A$, $J_B$, $J_C$, $J_D$ are composed of the same conductive material as the wiring layers $W_A$, $W_B$, $W_C$, $W_D$. The guard ring layers $J_A$, $J_B$, $J_C$, $J_D$ are not electrically coupled to the pixel circuit 110, and are independent of the wiring layers $W_A$, $W_C$, $W_C$, $W_D$ constituting the pixel circuit 110. The guard ring layers $J_A$, $J_B$, $J_C$, $J_D$ are in the same layer as the circuit layer 5 and, by surrounding the pixel circuit 110 in a substantially frame shape, have a function of suppressing the entry of moisture, oxygen, and the like from a side surface of the element substrate 10 into the pixel circuit 110.

The conductive body 71 composed of a stacked film of titanium and an aluminum/copper alloy is provided in the pixel area of the display region E1 above the interlayer insulating film $L_E$. The conductive body 71 is electrically coupled to one electrode of the transistors T. A conductive body 72 composed of the same formation material having optical reflectivity as that of the conductive body 71 is provided in the terminal region E2 above the interlayer insulating film $L_E$. The conductive body 72 is electrically coupled to one electrode of the transistors T.

A Cav adjustment layer 61 composed of silicon nitride is formed covering the conductive bodies 71, 72, on the interlayer insulating film $L_E$. A flattening layer 37 composed of silicon oxide and a light-shielding layer 39 composed of titanium nitride are formed on the Cav adjustment layer 61. A first optical adjustment layer 62 is formed covering the flattening layer 37 and the light-shielding layer 39, and a second optical adjustment layer 63 is stacked covering the first optical adjustment layer 62. As the formation material of the first optical adjustment layer 62 and the second optical adjustment layer 63, silicon oxide is used.

The mounting terminal 103 having a substantially rectangular shape is planarly formed on the conductive body 72. The mounting terminal 103 is disposed in a longitudinal direction along the Y-axis. The mounting terminal 103 is electrically coupled to the conductive body 72 and a plurality of wiring layers below the conductive body 72. The mounting terminal 103 functions as a coupling terminal to the external coupling substrate 104 of the element substrate 10. As the formation material of the mounting terminal 103, ITO, aluminum, or the like is used.

The pixel electrode 31 is formed on the second optical adjustment layer 63. A pixel separation layer 38 configured to expose a portion of the pixel electrode 31 and separate the sub-pixels 20R, 20G, 20B (not illustrated) adjacent to each other is formed on the second optical adjustment layer 63 including the pixel electrode 31. The pixel separation layer 38 is formed in the terminal region E2 as well. The pixel separation layer 38 of the terminal region E2 is disposed surrounding the opening portion 35A in plan view.

The light emission function layer 32 is in contact with the pixel electrode 31 and formed in a region defined by the pixel separation layer 38. The light emission function layer 32 includes, for example, a hole injection layer, a hole transport layer, an organic light-emitting layer, an electron transport layer, and an electron injection layer. In this exemplary embodiment, the hole injection layer, the hole transport layer, the organic light-emitting layer, the electron transport layer, and the electron injection layer are sequentially formed in this order on the pixel electrode 31 to form the light emission function layer 32. To form each layer of the light emission function layer 32, a vapor-phase process such as a vacuum deposition method is used.

Note that the configuration of the light emission function layer 32 is not limited to the above, and may further include an intermediate layer configured to control the movement of holes and electrons serving as carriers. Further, the organic light-emitting layer may be made to take on the function of the electron transport layer to reduce the layer configuration of the light emission function layer 32. The organic light-emitting layer need only be capable of emitting white light and, as the light-emitting layer, for example, a plurality of organic light-emitting layers capable of emitting red, green, and blue light may be used in combination.

The common electrode 33 is formed covering the light emission function layer 32. The common electrode 33 is a common cathode of the plurality of organic EL elements 30. Thus, the organic EL elements 30 are formed. The common electrode 33 is formed at a film thickness such that optical transparency and optical reflectivity are exhibited, using alloys of magnesium and silver, for example, as the formation material. The film thickness is, for example, about from 10 nm to 30 nm. A light transmittance, which is an index of the above-described optical transparency, is preferably 20% to 80%, inclusive. A light reflectance, which is an index of the above-described optical reflectivity, is preferably 20% to 80%, inclusive.

With the common electrode 33 provided with optical transparency and optical reflectivity, an optical resonance structure can be constructed between the conductive body 71 and the common electrode 33 for each of the sub-pixels 20R, 20G, 20B. The optical resonance structure is a structure in which light of a specific resonant wavelength is extracted by varying an optical distance between the conductive body 71 and the common electrode 33 for each of the sub-pixels 20R, 20G, 20B. The optical resonance structure increases a color purity from each of the sub-pixels 20R, 20G, 20B.

The optical distance described above is calculated as the sum of the products of the refractive index and the film thickness of each of the various function layers interposed between the conductive body 71 and the common electrode 33. Therefore, methods of varying the above-described optical distance for each of the sub-pixel 20R, 20G, 20B include a method of varying the film thickness of the pixel electrode 31 for each color, a method of varying the film thicknesses of the first optical adjustment layer 62 and the second optical adjustment layer 63 between the conductive body 71 and the pixel electrode 31, and the like. With the organic EL device 100 provided with an optical resonance structure, the light emitted from the organic EL element 30 is light emitted from the common electrode 33 toward the protective film 34 side, and has a spectrum different from the light emitted inside the light emission function layer 32.

A protective film 34 is formed covering the organic EL element 30. The protective film 34 has gas barrier properties for protecting the organic EL element 30. Due to the gas barrier properties, the protective film 34 suppresses the entry of moisture, oxygen, and the like into the organic EL element 30. In the protective film 34 of this exemplary embodiment, a first protective film 34a, a buffer layer 34b, and a second protective film 34c are stacked sequentially upward from the common electrode 33. Here, the first protective film 34a and the second protective film 34c of the protective film 34 are examples of a protective film according to the present disclosure.

The gas barrier properties of the protective film 34 are not particularly limited as long as the gas barrier properties can suppress the entry of the moisture and oxygen within the atmosphere into the organic EL element 30. Specifically, the gas barrier properties are preferably an oxygen permeability of 0.01 cc/m$^2$/day, and preferably a water vapor permeability of $7\times10^{-3}$ g/m$^2$/day, more preferably $5\times10^{-4}$ g/m$^2$/day, and even more preferably $5\times10^{-6}$ g/m$^2$/day. Further, the light transmittance, which is an index of the optical transparency of the protective film 34, is preferably 80% or greater with respect to the light emitted from the common electrode 33 side.

As the formation material of the first protective film 34a and the second protective film 34c, an inorganic material having the gas barrier properties and optical transparency described above is used. Examples of the inorganic material include materials having silicon oxide, silicon nitride, silicon oxynitride, or the like as a main component.

To form the first protective film 34a and the second protective film 34c, a vacuum deposition method, a sputtering method, a chemical vapor deposition (CVD) method, an ion plating method, or the like can be adopted. While the gas barrier properties improve as the film thickness of the first protective film 34a and the second protective film 34c are increased, cracks readily occur in the films due to internal stress caused by expansion and contraction in the films. Accordingly, the first protective film 34a and the second protective film 34c each preferably have a film thickness of about from 200 nm to 1000 nm. In the protective film 34 of this exemplary embodiment, the first protective film 34a and the second protective film 34c are layered with the buffer layer 34b interposed therebetween to improve the gas barrier properties.

As the formation material of the buffer layer 34b, an epoxy-based resin, silicon oxide, or the like having excellent thermal stability is used. To form the buffer layer 34b, a printing method such as screen printing, a constant discharge method, or the like can be used. When these methods are used, a front surface of the buffer layer 34b is flattened compared to when other methods are used. Thus, the buffer layer 34b has a function of reducing and flattening the unevenness of a front surface of the first protective film 34a. A thickness of the buffer layer 34b is from 1.0 μm to 5.0 μm, and preferably from 1.5 μm to 2.0 μm from the perspective of flattening.

As described above, the buffer layer 34b is interposed between the first protective film 34a and the second protective film 34c in the display region E1. In contrast, in the terminal region E2, the buffer layer 34b is not interposed between the first protective film 34a and the second protective film 34c. In the display area E1, slight unevenness occurs due to structures such as the pixel circuit 110 and the organic EL element 30, and therefore the buffer layer 34b is interposed to reduce the unevenness. In the terminal region E2, the organic EL element 30 and the like are not present in the lower portion, and therefore the unevenness is less than that in the display region E1 and the buffer layer 34b can be omitted.

An opening portion 35A is provided to the first protective film 34a and the second protective film 34c in the terminal region E2, on the mounting terminal 103. The opening portion 35A is substantially rectangular with a longitudinal direction along the Y-axis, planarly corresponding to the shape of the mounting terminal 103. The opening portion 35A upwardly exposes at least a portion of a front surface of the mounting terminal 103.

The first protective film 34a and the second protective film 34c are provided with a recessed portion 91A that communicates with the opening portion 35A. Specifically, the recessed portion 91A extends from the opening portion 35A to a side surface of the element substrate 10 in the −Y direction. The first protective film 34a and the second protective film 34c are not provided in a region of the recessed portion 91A except above the guard ring layers $J_A$ to $J_D$. The first protective film 34a and the second protective film 34c are provided above the guard ring layers $J_A$ to $J_D$ in the recessed portion 91A to prevent the occurrence of a short-circuit between the guard ring layers $J_A$ to $J_D$ and an external coupling terminal 108.

In regions except above the guard ring layers $J_A$ to $J_D$, a height of the recessed portions 91A in the +Z direction is lower than that of the front surface of the mounting terminal 103, and the −Y direction of the mounting terminal 103 is recessed to substantially the same height as that of the interlayer insulating film. Further, in the region above the guard ring layers $J_A$ to $J_D$, the height of the recessed portion 91A is lower than that of a front surface of the second protective film 34c on the display region E1 side of the opening portion 35A. Therefore, when the external coupling substrate 104 is mounted onto the element substrate 10, the air in the opening portion 35A readily moves into the recessed portion 91A and is more readily released from the side surface of the element substrate 10 in the −Y direction. Thus, when the element substrate 10 and the external coupling substrate 104 are adhered, air bubbles are less likely to remain in the opening portion 35A or the recessed portion 91A.

The recessed portion 91A is formed simultaneously with the opening portion 35A in the manufacturing process of the organic EL device 100. Specifically, the first protective film 34a and the second protective film 34c in the region where the opening portion 35A and the recessed portion 91A are provided are removed by etching using an insulating layer 43 provided on the protective film 34 as a mask, for example. After the insulating layer 43 is used as a mask, an area thereof other than that in the display region E1 is removed by etching using the protective substrate 70 as a mask.

The method used for the above-described etching is a known method. When an inorganic material such as silicon oxide, silicon nitride, or silicon oxynitride is used for the first protective film 34a and the second protective film 34c, dry etching using a fluorine-based treatment gas can be adopted. Note that the formation of the recessed portion 91A is not limited to being simultaneous with the formation of the opening portion 35A, and may be implemented in a step before or after the formation of the opening portion 35A.

The color filter 50 including the colored layers 50R, 50G, 50B corresponding to each of the color sub-pixels 20R, 20G, 20B is disposed on the protective film 34. The colored layers 50R, 50G, 50B are each formed by, for example, forming a layer using a photosensitive resin including a color material corresponding to the color, and then exposing and developing the layer using a photolithography method.

A film thickness of each of the colored layers 50R, 50G, 50B may be the same for each color or at least one color may be made different from the other colors. The film thicknesses of the colored layers 50R, 50G, 50B are set according to a chromaticity and a white balance obtained when light from the organic EL element 30 passes through the color filter 50.

The protective substrate 70 is bonded to the display region E1 of the element substrate 10 with a filler 42 interposed therebetween. The filler 42 wets and spreads over the color filter 50 and the like on the element substrate 10 front surface, suppressing the occurrence of air bubbles, and adheres the element substrate 10 and the protective substrate 70. Further, the filler 42 has optical transparency for transmitting light emitted from the organic EL element 30. As the formation material of the filler 42, a urethane-based resin, an acrylic-based resin, an epoxy-based resin, an olefin-based resin, or the like is used. A thickness of the filler 42 is approximately from 10 μm to 100 μm, for example.

The external coupling substrate 104 is disposed facing the terminal region E2 of the element substrate 10. The external coupling substrate 104 and the element substrate 10 are bonded and fixed with an anisotropic conductive film (ACF) 106, which is an anisotropic conductive adhesive, interposed therebetween. The ACF 106 includes a thermosetting resin 106a and metal particles 106b that are fine and dispersed in the thermosetting resin 106a.

When the element substrate 10 and the external coupling substrate 104 are bonded, the opening portion 35A is filled with the ACF 106, and the mounting terminal 103 of the element substrate 10 and the external coupling terminal 108 of the external coupling substrate 104 are electrically coupled via the metal particles 106b. Note that an anisotropic conductive paste (ACP) may be used instead of the ACF 106.

In the manufacturing process of the organic EL device 100, attaching the external coupling substrate 104 to the element substrate 10 proceeds sequentially in the order of an adhering step, a temporary crimping step, and an actual crimping step, for example. In an element substrate in the related art, the opening portion that exposes the mounting terminal is a depression having a planarly substantially rectangular shape and provided in the protective film. Therefore, when the element substrate and the external coupling substrate 104 are bonded in the adhering step, air bubbles may remain in the above-described depression. In particular, in the ACF 106, when the content of the metal particles 106b is high, when the viscosity of the thermosetting resin 106a is high, or the like, air bubbles very readily remain. This makes it difficult to bring into close contact the element substrate and the external coupling substrate 104 and, even if the temporary crimping step and the actual crimping step proceed, the adhesion between the element substrate and the external coupling substrate 104 is not secured and peeling is likely to occur. In this exemplary embodiment, because the recessed portion 91A is provided, air bubbles are unlikely to remain in the opening portion 35A, and thus the element substrate 10 and the external coupling substrate 104 readily come into close contact.

Figure 5:
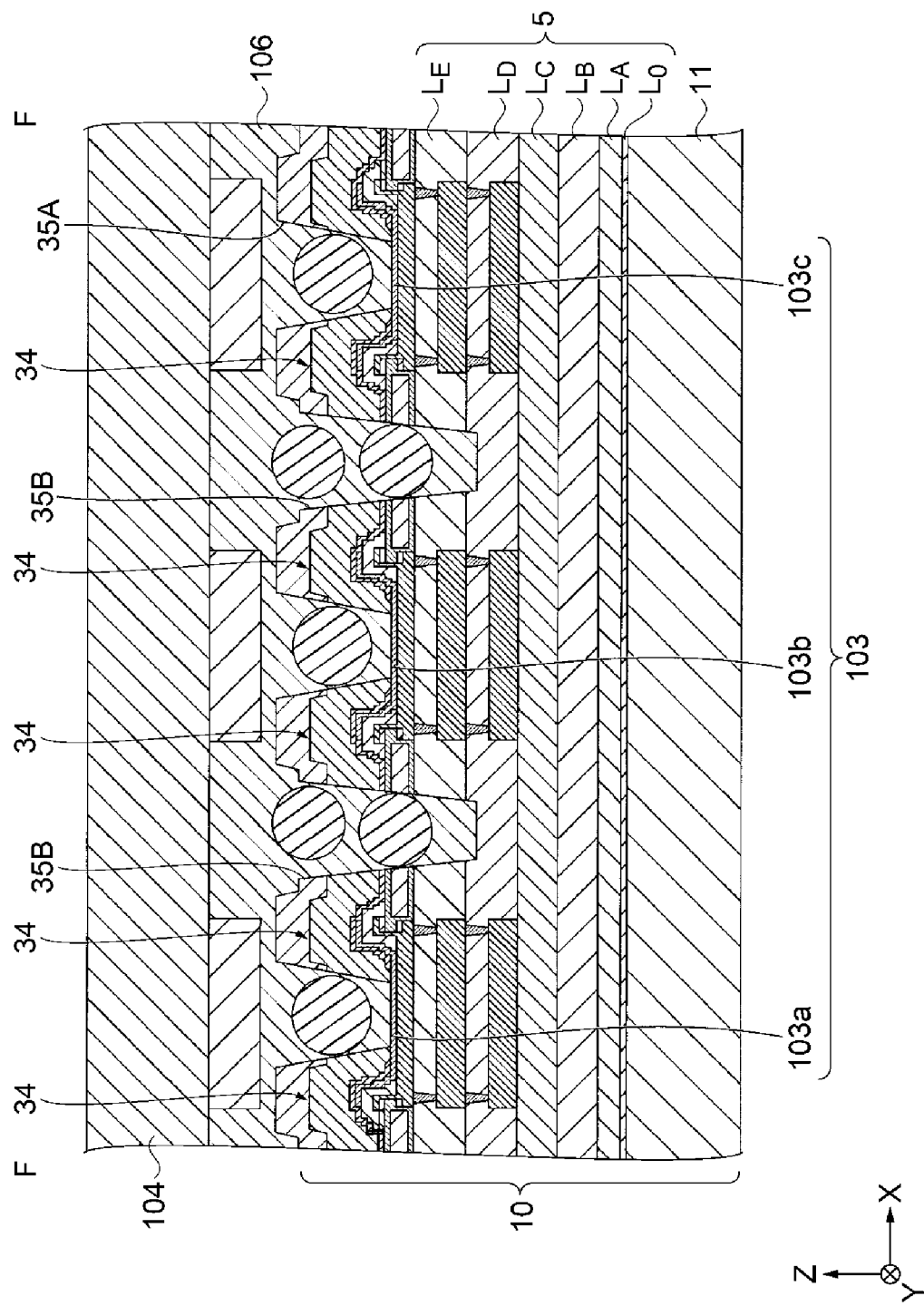
FIG. 5 is a schematic cross-sectional view of the organic EL device along line F-F in FIG. 1.

As illustrated in FIG. 5, the mounting terminals 103 of the element substrate 10 are disposed adjacent to each other in the direction along the X-axis, and each includes a first mounting terminal 103a, a second mounting terminal 103b, and a third mounting terminal 103c. Although not illustrated, the plurality of mounting terminals 103, each including the first mounting terminal 103a, the second mounting terminal 103b, and the third mounting terminal 103c, are disposed at substantially equal intervals in the direction along the X-axis.

The protective film 34 is provided with a groove portion 35B between the first mounting terminal 103a and the second mounting terminal 103b, and between the second mounting terminal 103b and the third mounting terminal 103c. Similarly, although not illustrated, the groove portion 35B is provided between the other of the plurality of mounting terminals 103 as well.

The groove portion 35B is provided penetrating the first protective film 34a and the second protective film 34c as well as the plurality of layers below. Specifically, the groove portion 35B is formed from the second protective film 34c to the interlayer insulating film $L_D$ of the circuit layer 5. The groove portion 35B is a groove having a concave shape including a portion of the interlayer insulating film $L_E$ and the interlayer insulating film $L_D$ on the upper side of the circuit layer 5.

The groove portion 35B has a depth in the −Z direction deeper than that of the opening portion 35A. Therefore, when the external coupling substrate 104 is mounted onto the element substrate 10, the groove portion 35B is filled with a greater amount of the ACF 106 than the opening portion 35A. This increases an adhesive area between the element substrate 10 and the external coupling substrate 104. Note that, in the present disclosure, the groove portion 35B is not a necessary component, and the groove portion 35B need not be provided.

A planar size of the groove portion 35B is set as appropriate. The groove portion 35B is connected to a groove portion 35C, which is described later, extending in the direction along the Y-axis, which is the longitudinal direction of the mounting terminal 103. The groove portion 35B is formed simultaneously with the opening portion 35A in the manufacturing process of the organic EL device 100. To form the groove portion 35B, the same method as that for the recessed portion 91A described above can be adopted.

1.2 Configuration of Recessed Portion

Figure 6:
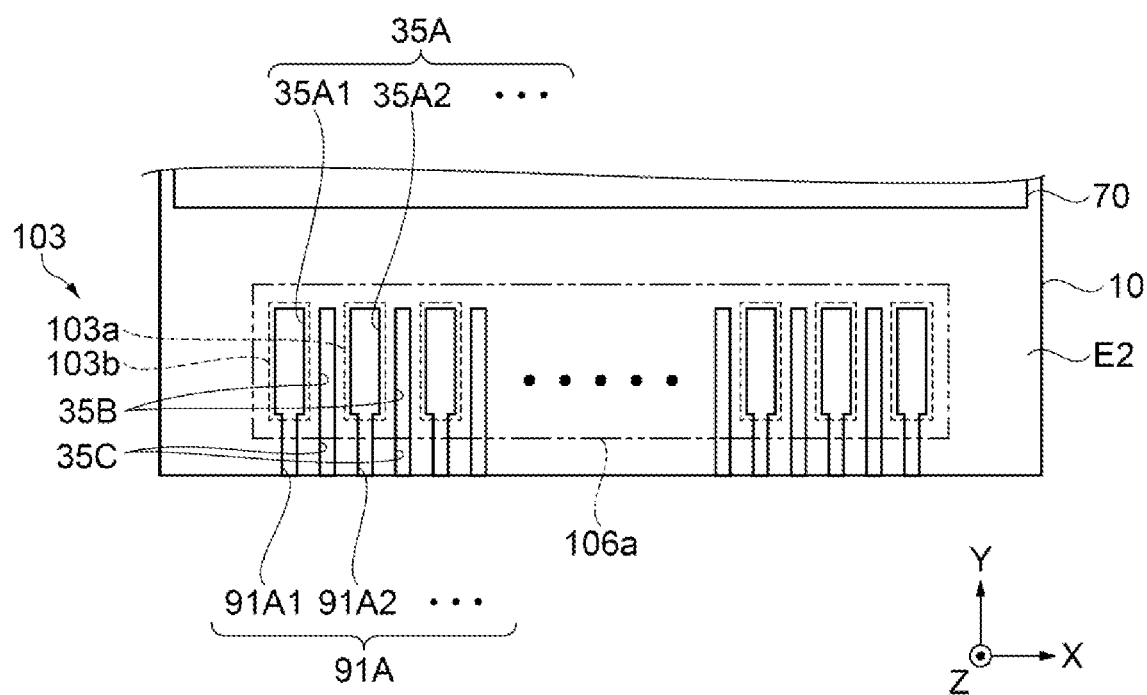
FIG. 6 is a schematic plan diagram illustrating a configuration of a recessed portion.

A configuration of the recessed portion 91A according to this exemplary embodiment will now be described with reference to FIG. 6. In FIG. 6, the terminal region E2 of the element substrate 10 is displayed enlarged, and illustrations other than those of the recessed portion 91A and related main portions are omitted. Further, the region to which the thermosetting resin 106a of the ACF 106 is adhered is indicated by a two-dot chain line. Note that, in the description of FIG. 6 below, a state in plan view is described unless otherwise specified.

As illustrated in FIG. 6, the opening portion 35A includes a first opening portion 35A1 corresponding to the first mounting terminal 103a and a second opening portion 35A2 corresponding to the second mounting terminal 103b. That is, the opening portions 35A are provided correspondingly to the plurality of mounting terminals 103. The plurality of openings portions 35A are substantially rectangular in correspondence with the mounting terminals 103.

The recessed portion 91A includes a first recessed portion 91A1 and a second recessed portion 91A2. The first recessed portion 91A1 communicates with a side of the first opening portion 35A1 in the −Y direction. The second recessed portion 91A2 communicates with a side of the second opening portion 35A2 in the −Y direction. That is, the recessed portions 91A are provided correspondingly to the plurality of openings portions 35A. Each of the plurality of recessed portions 91A extends from the corresponding opening portion 35A toward an outer edge of the element substrate 10 in the −Y direction, and passes through the side surface of the element substrate 10 in the −Y direction. Therefore, the recessed portion 91A is exposed on the side surface of the element substrate 10 in the −Y direction. In the direction along the X-axis, a width of the recessed portion 91A is narrower than a width of the opening portion 35A. A portion of the recessed portion 91A is configured to be exposed from the region of the two-dot chain line to which the thermosetting resin 106a of the ACF 106 is adhered.

Here, the recessed portion 91A is not limited to penetrating through the side surface of the element substrate 10 in the −Y direction, and may not penetrate the side surface. Further, the arrangement of the recessed portion 91A with respect to the opening portion 35A is not limited to the above. For example, the recessed portion 91A may be in the +Y direction of the opening portion 35A and, from there, extend in the +Y direction to the vicinity of the protective substrate 70.

The groove portion 35B is provided between the plurality of mounting terminals 103 adjacent to each other, including between the first mounting terminal 103a and the second mounting terminal 103b. These plurality of groove portions 35B are between the mounting terminals 103 adjacent to each other and communicate with the groove portions 35C provided between the recessed portions 91A adjacent to each other. Each of the groove portions 35C extends from the region coupled to the groove portion 35B toward the outer edge of the element substrate 10 in the −Y direction, and passes through the side surface of the element substrate 10 in the −Y direction. Therefore, the groove portion 35C is exposed on the side surface of the element substrate 10 in the −Y direction. In the direction along the X-axis, a width of the groove portions 35B, 35C is narrower than the width of the opening portion 35A. Here, the plurality of groove portions 35C are not limited to penetrating the side surface of the element substrate 10 in the −Y direction, and may not penetrate the side surface. A portion of the groove portion 35C is configured to be exposed from the region of the two-dot chain line to which the thermosetting resin 106a of the ACF 106 is adhered. The recessed portion 91A and the groove portions 35B, 35C may have the same depth, or one may have a depth different from that of the others.

According to this exemplary embodiment, the following advantages can be obtained.

When the external coupling substrate 104 is attached to the element substrate 10, the adhesion between the element substrate 10 and the external coupling substrate 104 can be improved. Specifically, because the opening 35A communicates with the recessed portion 91A, when the ACF 106 is adhered to the element substrate 10, the air in the opening portion 35A moves to the recessed portion 91A. Therefore, the element substrate 10 and the ACF 106 are more readily brought into close contact. This facilitates the release of air, readily bringing the element substrate 10 and the ACF 106 into close contact, even when the film thicknesses of the first protective film 34a and the second protective film 34c are large, increasing the steps between the surfaces of these layers and the mounting terminal 103. That is, this makes it possible to provide the organic EL device 100 that more steadily adheres the element substrate 10 and the external coupling substrate 104 than in the related art.

The plurality of recessed portions 91A extend toward the outer edge of the element substrate 10 in the −Y direction, allowing the air to more readily escape. This makes it possible to further improve the adhesion between the element substrate 10 and the external coupling substrate 104.

The groove portion 35B is provided between the mounting terminals 103 adjacent to each other and therefore is filled with the ACF 106. Therefore, the adhesive area between the element substrates 10 and the ACF 106 increases, improving the adhesion between the element substrate 10 and the external coupling substrate 104. Further, because the groove portion 35B extends toward the outer edge of the element substrate 10 in the −Y direction, the air in the groove portion 35B can readily escape toward the above-described outer edge.

2. Second Exemplary Embodiment

In this exemplary embodiment, an organic EL device serving as an electro-optical device is illustrated in the same manner as in the first exemplary embodiment. The organic EL device according to this exemplary embodiment differs from the organic EL device 100 of the first exemplary embodiment in the form of the recessed portion of the element substrate. Therefore, the same components as those in the first exemplary embodiment are given the same reference signs, and redundant descriptions thereof will be omitted.

Figure 7:
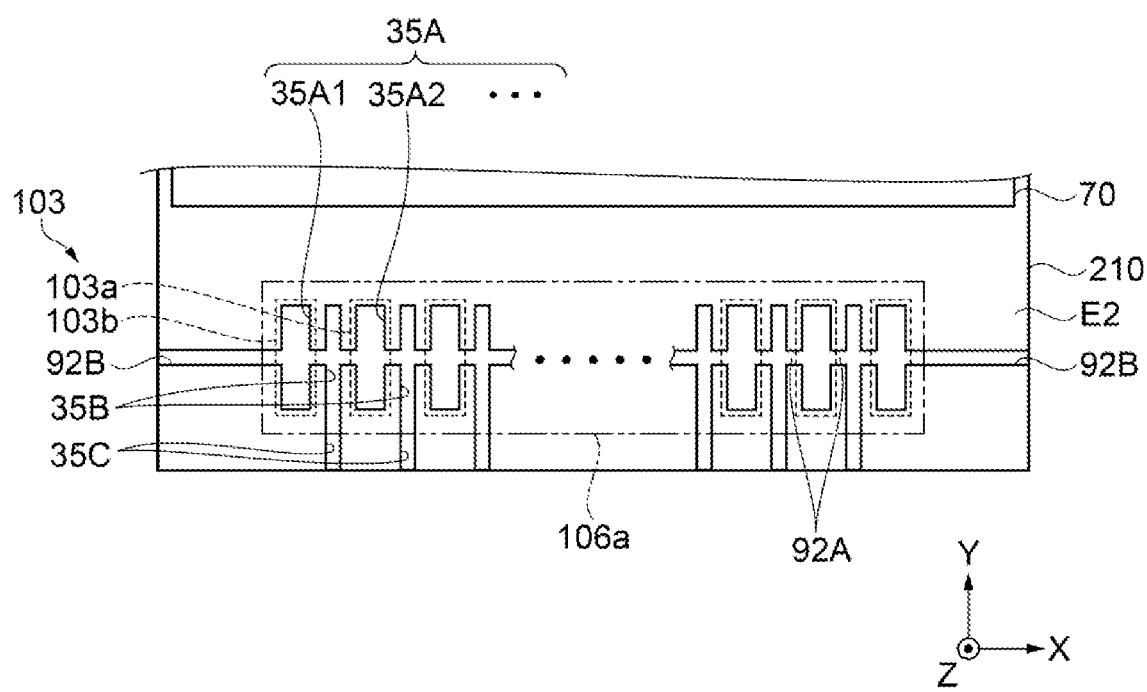
FIG. 7 is a schematic plan diagram illustrating a configuration of a recessed portion according to a second exemplary embodiment.

A configuration of an element substrate 210 according to this exemplary embodiment will now be described with reference to FIG. 7. In FIG. 7, the terminal region E2 of the element substrate 210 is displayed enlarged, and illustrations other than those of the recessed portion and related main portions are omitted. Further, the region to which the thermosetting resin 106a of the ACF 106 is adhered is indicated by a two-dot chain line. Note that, in the description of FIG. 7 below, a state in plan view is described unless otherwise specified.

As illustrated in FIG. 7, the organic EL device of this exemplary embodiment includes the element substrate 210, the protective substrate 70, and the external coupling substrate 104 (not illustrated). In the terminal region E2 of the element substrate 210, the plurality of opening portions 35A including the first opening portion 35A1 and the second opening portion 35A2 are provided in the first protective film 34a and the second protective film 34c (not illustrated). The first opening portion 35A1 corresponds to the first mounting terminal 103a, and the second opening portion 35A2 corresponds to the second mounting terminal 103b.

The first protective film 34a and the second protective film 34c are provided with a recessed portion 92A that communicates with the plurality of openings 35A including the first opening portion 35A1 and the second opening portion 35A2. The recessed portion 92A communicates with the plurality of groove portions 35B as well. Note that the groove portions 35B may be omitted and, in this case, the recessed portion 92A may communicate with the plurality of opening portions 35A including the first opening portion 35A1 and the second opening portion 35A2.

The recessed portion 92A extends in the direction along the X-axis, connecting the plurality of opening portions 35A including the first opening portion 35A1 and the second opening portion 35A2. In other words, the recessed portion 92A is disposed in the above-described direction, crossing the plurality of opening portions 35A and the plurality of groove portions 35B disposed in the direction along the X-axis. Further, a recessed portion 92B is provided in an area from the first opening portion 35A1 and a side surface of the element substrate 210 in the −X direction, and in an area from the opening portion 35A closest in the +X direction to a side surface of the element substrate 210 in the +X direction. The recessed portions 92B penetrate the side surfaces of the element substrate 210 in the −X direction and the +X direction. Note that the recessed portions 92B are not limited to penetrating the above-described side surfaces. A portion of the recessed portion 92B is configured to be exposed from the region of the two-dot chain line to which the thermosetting resin 106a of the ACF 106 is adhered.

The recessed portions 92A, 92B communicate with the opening portion 35A in the middle of the opening portion 35A in the longitudinal direction. A width of the recessed portions 92A, 92B in the direction along the Y-axis, while not particularly limited, is, for example, the same as the width of the groove portion 35B in the direction along the X-axis. The position at which the recessed portions 92A, 92B communicate with the opening portion 35A may be a center of the opening portion 35A in the longitudinal direction, may be an end of the opening portion 35A closer to the display region E1 in the longitudinal direction, may be the element substrate 10 front surface side of the opening portion 35A in the −Y direction of the longitudinal direction, or may be the center of the region of the two-dot chain line to which the thermosetting resin 106a of the ACF 105 is adhered. The recessed portions 92A, 92B and the groove portions 35B, 35C may have the same depth, or one may have a depth different from that of the others.

According to this exemplary embodiment, the following advantages can be obtained in addition to those of the first exemplary embodiment.

Because the plurality of opening portions 35A are communicated in the direction along the X-axis by the recessed portions 92A, 92B, it is possible to further facilitate the escape of air when the element substrate 210 and the external coupling substrate 104 are attached.

3. Third Exemplary Embodiment

In this exemplary embodiment, an organic EL device serving as an electro-optical device is illustrated in the same manner as in the first exemplary embodiment. The organic EL device according to this exemplary embodiment differs from the organic EL device 100 of the first exemplary embodiment in the form of the recessed portion of the element substrate. Therefore, the same components as those in the first exemplary embodiment are given the same reference signs, and redundant descriptions thereof will be omitted.

Figure 8:
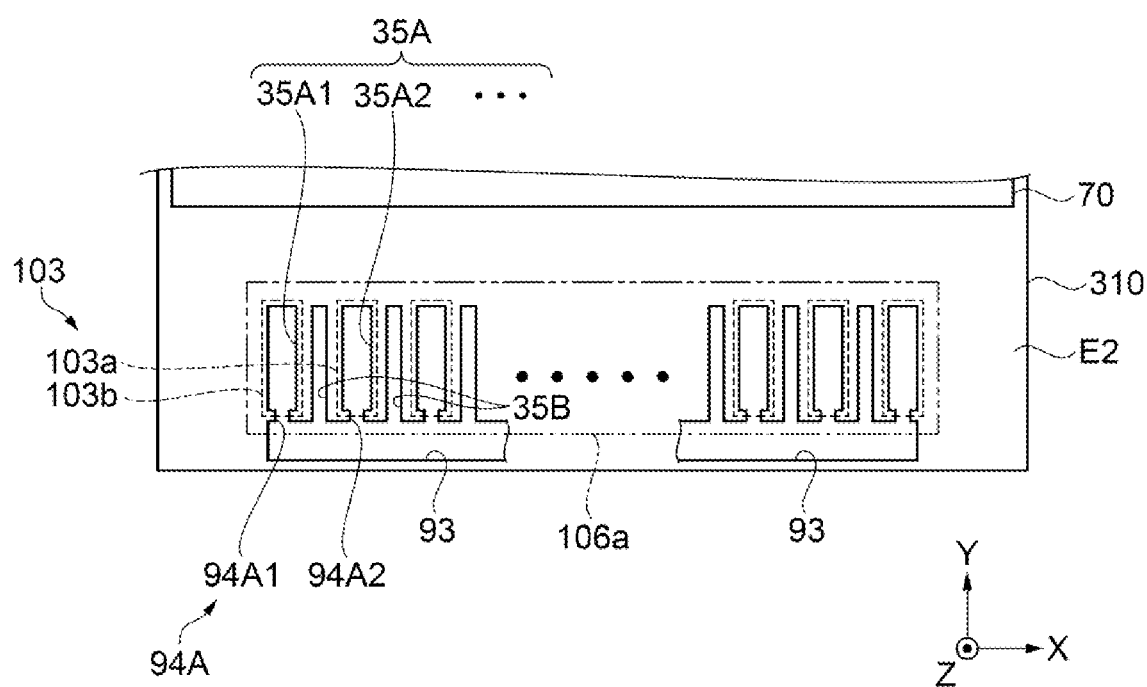
FIG. 8 is a schematic plan diagram illustrating a configuration of a recessed portion according to a third exemplary embodiment.

A configuration of an element substrate 310 according to this exemplary embodiment will now be described with reference to FIG. 8. In FIG. 8, the terminal region E2 of the element substrate 310 is displayed enlarged, and illustrations other than those of the recessed portion and related main portions are omitted. Further, the region to which the thermosetting resin 106a of the ACF 106 is adhered is indicated by a two-dot chain line. Note that, in the description of FIG. 8 below, a state in plan view is described unless otherwise specified.

As illustrated in FIG. 8, the organic EL device of this exemplary embodiment includes the element substrate 310, the protective substrate 70, and the external coupling substrate 104 (not illustrated). In the terminal region E2 of the element substrate 310, the plurality of opening portions 35A including the first opening portion 35A1 and the second opening portion 35A2 are provided in the first protective film 34a and the second protective film 34c (not illustrated). The first opening portion 35A1 corresponds to the first mounting terminal 103a, and the second opening portion 35A2 corresponds to the second mounting terminal 103b.

The first protective film 34a and the second protective film 34c are provided with a recessed portion 94A that includes a first recessed portion 94A1 and a second recessed portion 94A2, and a third recessed portion 93, as recessed portions. Specifically, the first recessed portion 94A1 communicates with a side of the first opening portion 35A1 in the −Y direction corresponding to the first opening portion 35A1. The second recessed portion 94A2 communicates with a side of the second opening portion 35A2 in the −Y direction corresponding to the second opening portion 35A2. Similarly, the plurality of recessed portions 94A other than the first recessed portion 94A1 and the second recessed portion 94A2 respectively communicate with the sides of the corresponding opening portions 35A in the −Y direction as well.

The third recessed portion 93 has a substantially rectangular shape elongated in the direction along the X-axis, and is provided between the plurality of opening portions 35A disposed in the direction along the X-axis and an outer edge of the element substrate 310 in the −Y direction. The third recessed portion 93 is wider in the direction along the X-axis than the recessed portion 94A including the first recessed portion 94A1 and the second recessed portion 94A2. Specifically, a width of the third recessed portion 93 in the direction along the X-axis is substantially equal to a distance between the first mounting terminal 103a and the mounting terminal 103 disposed at the end in the +X direction. A portion of the third recessed portion 93 is configured to be exposed from the region of the two-dot chain line to which the thermosetting resin 106a of the ACT 106 is adhered.

The third recessed portion 93, on a long side thereof in the +Y direction, communicates with the first opening portion 35A1 via the first recessed portion 94A1, and communicates with the second opening portion 35A2 via the second recessed portion 94A2. That is, the third recessed portion 93, on the long side thereof in the +Y direction, communicates with the plurality of opening portions 35A. Further, the third recessed portion 93 communicates with the plurality of groove portions 35B as well. Note that the arrangement and number of the third recessed portions 93 are not limited and the third recessed portions 93 may be disposed in the +Y direction of the plurality of mounting terminals 103. The recessed portion 94A, the recessed portions 93, and the groove portion 35B may have the same depth, or one may have a depth different from that of the others. Note that recessed portions equivalent to the recessed portions 92A, 92B of the element substrate 210 of the second exemplary embodiment may be provided in the element substrate 310 of this exemplary embodiment.

According to this exemplary embodiment, the following advantages can be obtained in addition to those of the first exemplary embodiment.

Because the third recessed portion 93 is wider than the first recessed portion 94A1 and the second recessed portion 94A2, it is possible to facilitate the escape of air from the first opening portion 35A1 to the third recessed portion 93 via the first recessed portion 94A1, and from the second opening portion 35A2 to the third recessed portion 93 via the second recessed portion 94A2. Similarly, it is possible to facilitate the escape of air from the groove portion 35B to the third recessed portion 93.

In the actual crimping step of attaching the external coupling substrate 104 to the element substrate 310, the element substrate 310 and the external coupling substrate 104 are crimped while being heated. In this case, gas may volatilize from the ACF 106 to generate air bubbles. The third recessed portion 93 functions as an air bubble reservoir having a large planar area. Therefore, even if generated from the ACF 106, the air bubbles can be collected and stored. This makes it possible to suppress a reduction in adhesion between the element substrate 310 and the external coupling substrate 104 caused by the above-described air bubbles.

4. Fourth Exemplary Embodiment

In this exemplary embodiment, an organic EL device serving as an electro-optical device is illustrated in the same manner as in the first exemplary embodiment. The organic EL device according to this exemplary embodiment differs from the organic EL device 100 of the first exemplary embodiment in the form of the vicinity of the recessed portion of the element substrate. Therefore, the same components as those in the first exemplary embodiment are given the same reference signs, and redundant descriptions thereof will be omitted.

A configuration of the element substrate 410 according to this exemplary embodiment and a method for forming adhesive portions described later will now be described with reference to FIG. 9A, FIG. 9B, FIG. 9C, FIG. 9D, and FIG. 9E. FIG. 9A to FIG. 9E each illustrate a cross section along the XZ plane of the element substrate 410 in the −Y direction from the mounting terminal 103. Further, in FIG. 9A to FIG. 9E, illustrations of portions other than the main portions such as the first recessed portion 91A1, the second recessed portion 91A2, and the groove portion 35C are omitted.

Figure 9A:
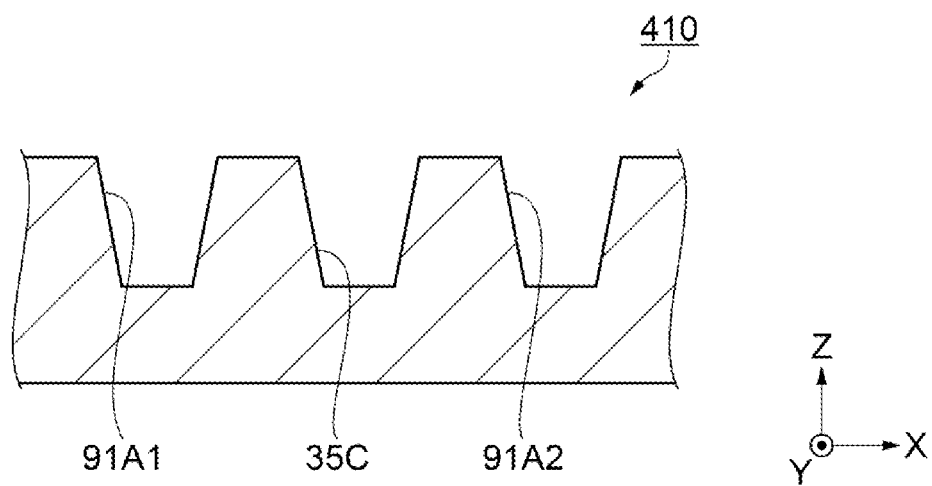
FIG. 9A is a schematic cross-sectional view illustrating a formation method of an adhesive portion according to a fourth exemplary embodiment.
Figure 9B:
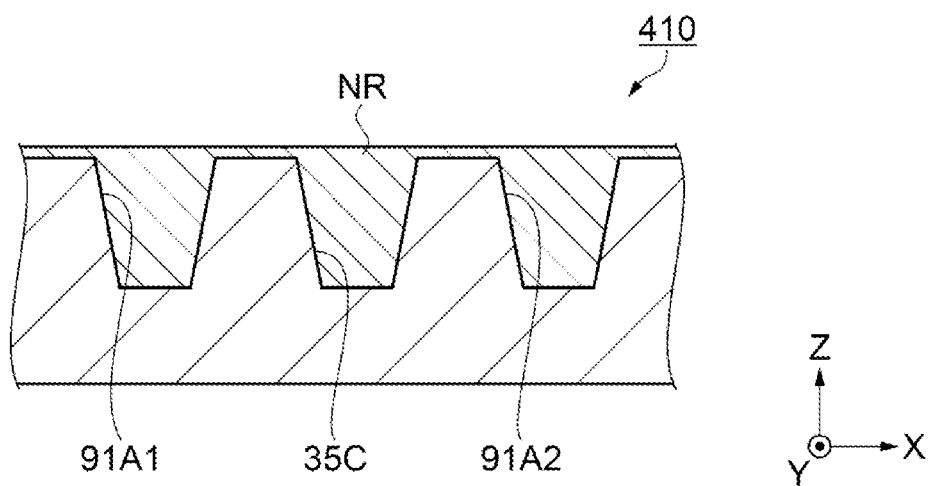
FIG. 9B is a schematic cross-sectional view illustrating the formation method of the adhesive portion.
Figure 9C:
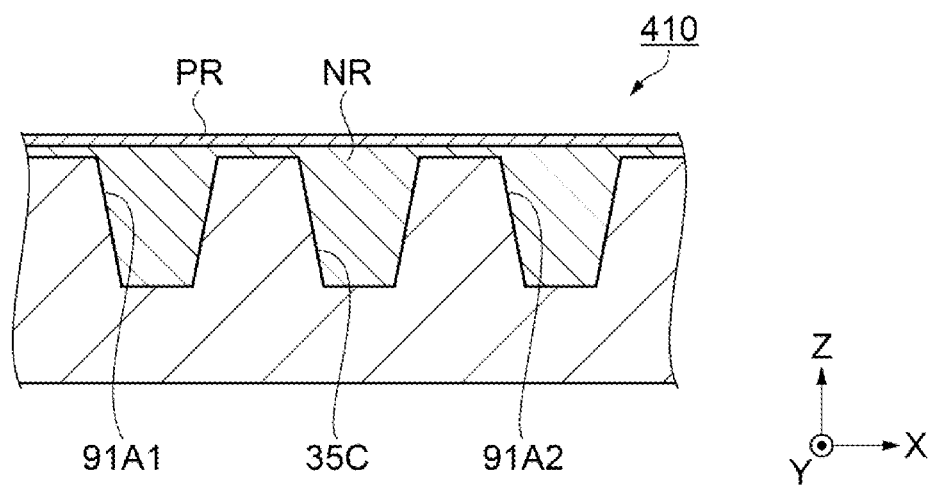
FIG. 9C is a schematic cross-sectional view illustrating the formation method of the adhesive portion.
Figure 9D:
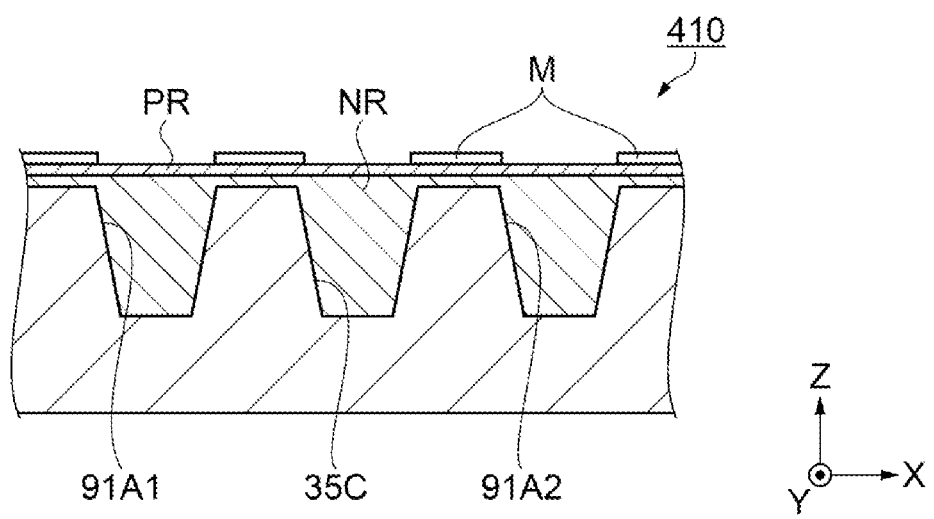
FIG. 9D is a schematic cross-sectional view illustrating the formation method of the adhesive portion.
Figure 9E:
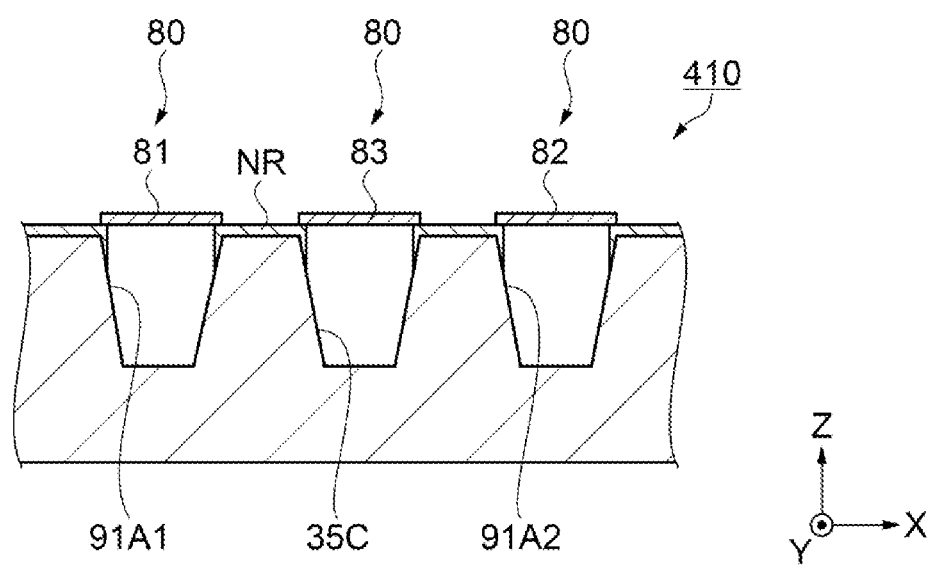
FIG. 9E is a schematic cross-sectional view illustrating the formation method of the adhesive portion.

As illustrated in FIG. 9E, the organic EL device according to this exemplary embodiment includes adhesive portions 81, 82, 83 on the element substrate 410, and this point differs from the organic EL device 100 of the first exemplary embodiment. The adhesive portion 81 is provided above the first recessed portion 91A1, and forms a space together with the first recessed portion 91A1. The adhesive portion 82 is provided above the second recessed portion 91A2, and forms a space together with the second recessed portion 91A2. The adhesive portion 83 is provided above the groove portion 35C between the recessed portions 91A adjacent to each other in the direction along the X-axis, and forms a space with the groove portion 35C. That is, in an element substrate 410, there are provided adhesive portions 80 including the adhesive portions 81, 82, 83 above the plurality of recessed portions 91A and the plurality of groove portions 35C. Note that the adhesive portions 81, 82 are examples of an adhesive portion of the present disclosure.

The adhesive portions 80 cover the recessed portions 91A and the groove portions 35C, reducing the unevenness of the terminal region E2. Note that, as in the first exemplary embodiment, because the plurality of opening portions 35A communicate with the corresponding recessed portions 91A, there is no change in the fact that the air in the plurality of opening portions 35A readily moves to the respective recessed portions 91A. Note that, while a cross-sectional view of the plurality of opening portions 35A is not illustrated, the view is similar to FIG. 5.

Next, a method for forming the adhesive portions 80 is described. As illustrated in FIG. 9A, as in the first exemplary embodiment, the first recessed portion 91A1, the second recessed portion 91A2, and the groove portion 35C are formed in the first protective film 34a and the second protective film 34c (not illustrated).

Next, as illustrated in FIG. 9B, a negative resist NR is applied to a front surface of the element substrate 410 including above the first recessed section 91A1, the second recessed section 91A2, and the channel portion 35C. A known method can be used for applying the negative resist NR. For example, a negative photosensitive resist is used to apply the negative resist NR using a spin coating method, a roll coating method, or the like.

Next, as illustrated in FIG. 9C, a positive resist PR is applied above the negative resist NR. To apply the positive resist PR, a known method can be adopted. For example, a positive photosensitive resist is used to apply the positive resist PR using a spin coating method, a roll coating method, or the like.

Next, as illustrated in FIG. 9D, a photomask M is disposed above the positive resist PR. The photomask M has a shape that planarly overlaps the first recessed portion 91A1, the second recessed portion 91A2, and the groove portion 35C. Subsequently, the negative resist NR and the positive resist PR are exposed via the photomask M and developed.

Thus, as illustrated in FIG. 9E, in the negative resist NR, regions blocked by the photomask M are exposed and removed. Similarly, in the positive resist PR, regions other than the regions blocked by the photomask M are exposed and removed, and the blocked regions become the adhesive portions 80. In this way, the adhesive portion 81 is provided on the first recessed portion 91A1, the adhesive portion 82 is provided on the second recessed portion 91A2, and the adhesive portion 83 is provided on the groove portion 35C. Note that the adhesive portions 80 are provided above the plurality of recessed portions 91A and the plurality of groove portions 35C other than those illustrated as well.

Here, in this exemplary embodiment, an example is given of a configuration in which the adhesive portion 80 is provided to the recessed portion 91A of the first exemplary embodiment. However, the configuration is not limited thereto. The adhesive portion may be provided above the recessed portion 92A, 92B of the second exemplary embodiment, the third recessed portion 93 of the third exemplary embodiment, and the like as well.

According to this exemplary embodiment, the following advantages can be obtained in addition to those of the first exemplary embodiment.

After the escape of air from the plurality of opening portions 35A and the plurality of groove portions 35B, 35C is secured, the unevenness of the terminal region E2 of the element substrate 410 is reduced to a greater extent than with the element substrate 10 of the first exemplary embodiment. As a result, when the adhesive portions 80 and the ACF 106 are bonded, the element substrate 410 and the ACF 106 are more readily brought into close contact. This makes it possible to further improve the adhesion between the element substrate 410 and the external coupling substrate 104.

5. Fifth Exemplary Embodiment

In this exemplary embodiment, an organic EL device serving as an electro-optical device is illustrated in the same manner as in the first exemplary embodiment. The organic EL device according to this exemplary embodiment differs from the organic EL device 100 of the first exemplary embodiment in the form of the element substrate. Therefore, the same components as those in the first exemplary embodiment are given the same reference signs, and redundant descriptions thereof will be omitted.

Figure 10:
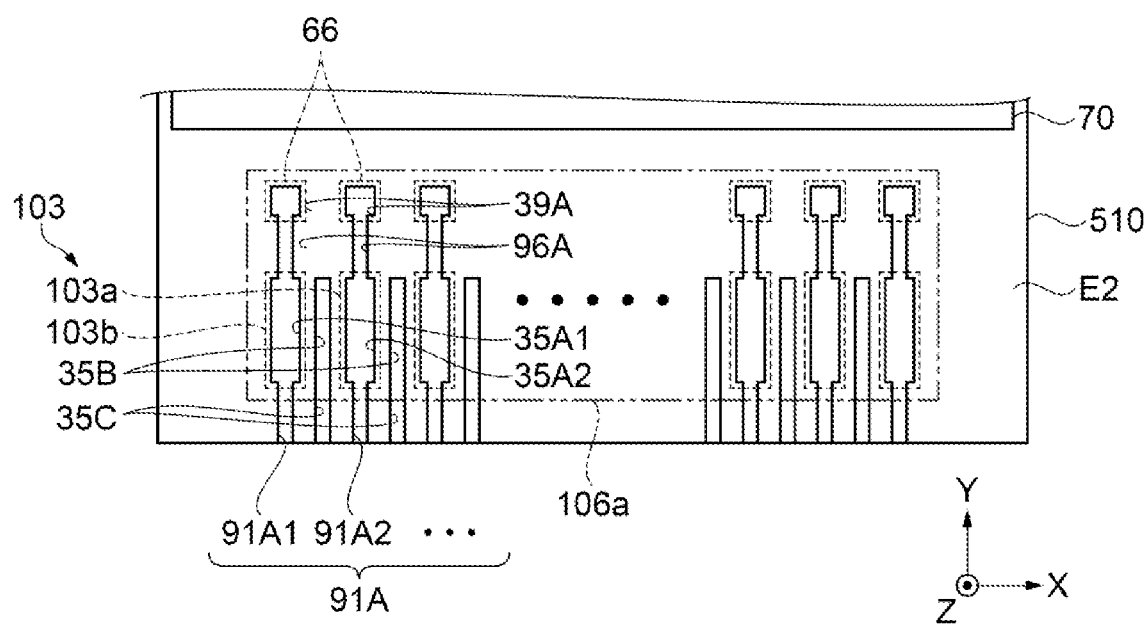
FIG. 10 is a schematic plan diagram illustrating a configuration of an element substrate according to a fifth exemplary embodiment.

A configuration of an element substrate 510 according to this exemplary embodiment will now be described with reference to FIG. 10. In FIG. 10, the terminal region E2 of the element substrate 510 is displayed enlarged, and illustrations other than those of the main portions are omitted. Further, the region to which the thermosetting resin 106a of the ACF 106 is adhered is indicated by a one-dot chain line. Note that, in the description of FIG. 10 below, a state in plan view is described unless otherwise specified.

As illustrated in FIG. 10, the organic EL device of this exemplary embodiment includes the element substrate 510, the protective substrate 70, and the external coupling substrate 104 (not illustrated). In the terminal region E2 of the element substrate 510, a plurality of inspection terminals 66 are provided between the plurality of mounting terminals 103 and the protective substrate 70. The element substrate 510 differs from the element substrate 10 of the first exemplary embodiment in that the element substrate 510 includes the inspection terminals 66 and an opening portion 39A and a recessed portion 96A associated with each of the inspection terminals 66.

The inspection terminals 66 are disposed in the +Y direction of the plurality of mounting terminals 103, respectively corresponding to the mounting terminals 103. The inspection terminals 66 are electrically coupled to the corresponding mounting terminals 103. The inspection terminals 66 are used for quality product inspections, property inspections, and the like performed in the manufacturing process of the organic EL device and the like. Specifically, when the mounting terminal 103 is formed of ITO, fine particles of the ITO may be generated as foreign material as a result of contact between an inspection probe used in the above-described inspection and the ITO. Therefore, the inspection terminal 66 is formed of aluminum or the like, for example, having a hardness lower than that of the inspection probe to suppress the generation of foreign material.

Similar to the mounting terminals 103, the inspection terminals 66 are upwardly exposed by the opening portions 39A provided in the first protective film 34a and the second protective film 34c (not illustrated). The opening portion 39A is disposed in each of the plurality of inspection terminals 66. The recessed portion 96A communicates with the −Y direction of the opening portion 39A. The recessed portions 96A respectively communicates with the +Y direction of the opening portions 35A. In other words, each of the opening portions 39A communicates with the recessed portion 96A, the opening portion 35A, and the recessed portion 91A. Note that a recessed portion equivalent to the recessed portion 93 of the third exemplary embodiment and an adhesive portion equivalent to the adhesive portion 80 of the fourth exemplary embodiment may be provided above the recessed portion 96A of this exemplary embodiment as well.

According to this exemplary embodiment, the following advantages can be obtained in addition to those of the first exemplary embodiment.

Because the inspection terminals 66 are provided, the mounting terminals 103 need not be used for inspection of the manufacturing process or the like, and damage to the mounting terminals 103 and the like can be prevented. Further, because the opening portion 39A of the inspection terminal 66 communicates from the recessed portion 96A to the recessed portion 91A, it is possible to facilitate the escape of air in the opening 39A when the element substrate 510 and the external coupling substrate 104 are attached.

6. Sixth Exemplary Embodiment

A head-mounted display is illustrated as an electronic apparatus according to this exemplary embodiment.

Figure 11:
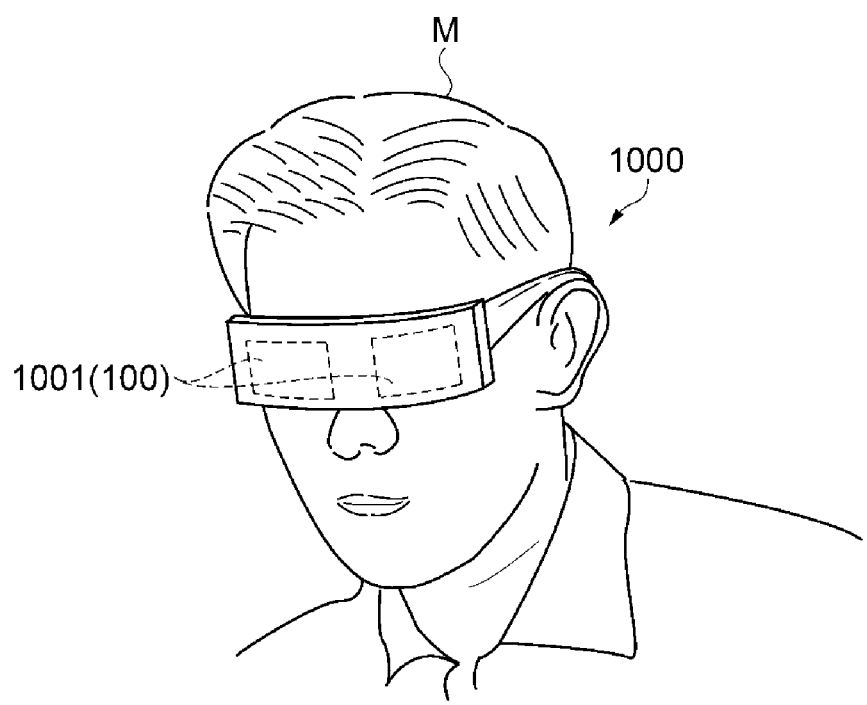
FIG. 11 is a schematic view illustrating a head-mounted display serving as an electronic apparatus according to a sixth exemplary embodiment.

As illustrated in FIG. 11, a head-mounted display 1000 as the electronic apparatus of this exemplary embodiment is mounted on a head of an observer M in an eyeglass manner. The head-mounted display 1000 includes two display units 1001 provided correspondingly to both eyes of the observer M. Thus, the observer M can see characters, images, and the like displayed on the display units 1001. Further, when the left and right display units 1001 display an image in which the parallax has been adjusted, the observer M can see a three-dimensional image.

The display units 1001 are each equipped with the organic EL device 100 as the electro-optical device according to the above-described exemplary embodiment. Further, an organic EL device as an electro-optical device of the above-described exemplary embodiment other than that of the first exemplary embodiment may be applied to the display units 1001.

Note that the head-mounted display 1000 is not limited to a configuration including the two display units 1001 corresponding to both eyes. For example, the head-mounted display 1000 may be configured to include the display unit 1001 corresponding to either the left or the right. The head-mounted display 1000 is furthermore not limited to a see-through type, and may instead be an immersive type in which the image is viewed in a state where the outside light is shielded.

Note that the electronic apparatus in which the organic EL device 100 of the above-described exemplary embodiments is mounted is not limited to the head-mounted display. The organic EL device 100 of the above-described exemplary embodiment can be suitably used as a display unit such as a head-up display (HUD), an electronic viewfinder (EVF), a portable information terminal, or the like.

According to this exemplary embodiment, the adhesion is improved between the element substrate 10 and the external coupling substrate 104, making the electrical coupling steadfast. This makes it possible to provide the head-mounted display 1000 having excellent reliability. Note that the exemplary embodiments described above describe examples of the present disclosure. The present disclosure is not limited to the exemplary embodiments described above, and variations, modifications, and the like within the scope in which the gist of the present disclosure is not changed are included in the present disclosure.

The invention claimed is:
1. An electro-optical device, comprising:
  a substrate including:
    a light-emitting element;
    a mounting terminal; and
    a protective film that is provided on the light-emitting element and that has an opening portion overlapping with the mounting terminal in a plan view, wherein
  the substrate has a recessed portion that communicates with the opening portion.

2. The electro-optical device according to claim 1, wherein
  in the plan view, the recessed portion extends from the mounting terminal toward an outer edge of the substrate.

3. The electro-optical device according to claim 1, further comprising:
  a first mounting terminal; and
  a second mounting terminal disposed adjacent to the first mounting terminal, wherein
  the protective film includes:
    a first opening portion corresponding to the first mounting terminal; and
    a second opening portion corresponding to the second mounting terminal, wherein
    the recessed portion extends so as to communicate between the first opening portion and the second opening portion.

4. The electro-optical device according to claim 1, further comprising:
  a first mounting terminal; and
  a second mounting terminal disposed adjacent to the first mounting terminal, wherein
  the protective film includes:
    a first opening portion corresponding to the first mounting terminal;

a second opening portion corresponding to the second mounting terminal;

a first recessed portion that communicates with the first opening portion;

a second recessed portion that communicates with the second opening portion; and a third recessed portion, wherein the third recessed portion is wider than the first recessed portion and the second recessed portion, communicates with the first opening portion via the first recessed portion, and communicates with the second opening portion via the second recessed portion.

5. The electro-optical device according to claim 4, wherein the protective film has a groove portion extending from a portion between the first mounting terminal and the second mounting terminal toward an outer edge of the substrate in the plan view.

6. The electro-optical device according to claim 5, wherein the groove portion communicates with the third recessed portion.

7. The electro-optical device according to claim 1, comprising:

an adhesive portion provided at the recessed portion and forming a space together with the recessed portion.

8. The electro-optical device according to claim 1, wherein in a thickness direction of the substrate, a distance between a base material and a bottom surface of the mounting terminal is longer than a distance between the base material and a bottom surface of the recessed portion.

9. The electro-optical device according to claim 1, wherein in a first direction of the plan view, the opening portion is wider than the recessed portion.

10. The electro-optical device according to claim 9, wherein in a second direction that intersects the first direction, in the plan view, the opening portion is longer than the recessed portion.

11. An electronic apparatus comprising:

the electro-optical device according to claim 1.

* * * * *